United States Patent
Callahan et al.

(10) Patent No.: US 7,173,851 B1
(45) Date of Patent: Feb. 6, 2007

(54) 3.5 TRANSISTOR NON-VOLATILE MEMORY CELL USING GATE BREAKDOWN PHENOMENA

(75) Inventors: John M. Callahan, San Ramon, CA (US); Hemanshu T. Vernenker, Santa Clara, CA (US); Michael D. Fliesler, Santa Cruz, CA (US); Glen Arnold Rosendale, Palo Alto, CA (US); Harry Shengwen Luan, Saratoga, CA (US); Zhongshang Liu, Plano, TX (US)

(73) Assignee: Kilopass Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/252,461

(22) Filed: Oct. 18, 2005

(51) Int. Cl.
 *G11C 11/34* (2006.01)
(52) U.S. Cl. .................. 365/185.05; 365/185.14; 365/185.17; 365/185.21; 365/185.28
(58) Field of Classification Search .......... 365/185.05, 365/185.14, 185.17, 185.21, 185.28
See application file for complete search history.

(56) References Cited

U.S. PATENT DOCUMENTS 6,243,294 B1 * 6/2001 Rao et al. .............. 365/185.14
6,972,986 B2 * 12/2005 Peng et al. ................ 365/149

* cited by examiner

*Primary Examiner*—Taun T. Nguyen
*Assistant Examiner*—Pho M. Luu
(74) *Attorney, Agent, or Firm*—Perkins Coie LLP

(57) ABSTRACT

A programmable memory cell formed useful in a memory array having column bitlines and row wordlines. The memory cell including a breakdown transistor having its gate connected to a program wordline and a write transistor connected in series at a sense node to said breakdown transistor. The gate of the write transistor is connected to a write wordline. Further, a first sense transistor has its gate connected to the sense node. A second sense transistor is connected in series to the first sense transistor and has its gate connected to a read wordline. The second sense transistor has its source connected to a column bitline.

7 Claims, 10 Drawing Sheets

3.5 TRANSISTOR NON-VOLATILE MEMORY CELL USING GATE BREAKDOWN PHENOMENA

TECHNICAL FIELD

The present invention relates to a nonvolatile programmable semiconductor memory, and more particularly, to a 3.5 transistor memory cell manufactured using CMOS logic processes.

BACKGROUND

Nonvolatile memory retains stored data when power is removed, which is desirable in many different types of electronic devices. Flash memory and fuse based memory are two types of non-volatile memory. However, non-volatile memory cells typically require specialized manufacturing process that are not compatible with CMOS logic processes.

Improvements in the various processes used for fabricating nonvolatile memory tend to lag improvements in widely used processes such as the advanced CMOS logic process. For example, processes for devices such as flash EEPROM devices use more mask steps than the standard advanced CMOS logic process to produce the various special regions and structures required for the high voltage generation circuits, the triple well, the floating gate, the ONO layers, and the special source and drain junctions typically found in such devices. Accordingly, processes for flash devices tend to be one or two generations behind the standard advanced CMOS logic process. As another example, processes for antifuses must be suitable for fabricating various antifuse structures and high voltage circuits, and so also tend to be about one generation behind the standard advanced CMOS process.

The observations above generally indicate that there are still disadvantages with each of the prior art memory technologies.

DETAILED DESCRIPTION

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is related to other types of gate oxide breakdown based non-volatile memory designs developed by the same assignee as the present invention. Examples are shown in U.S. Pat. Nos. 6,940,751, 6,777,757, and 6,667,902. The gate oxide breakdown structures described in those patents may, as one example, be used for the breakdown transistor element described below.

Figure 1:
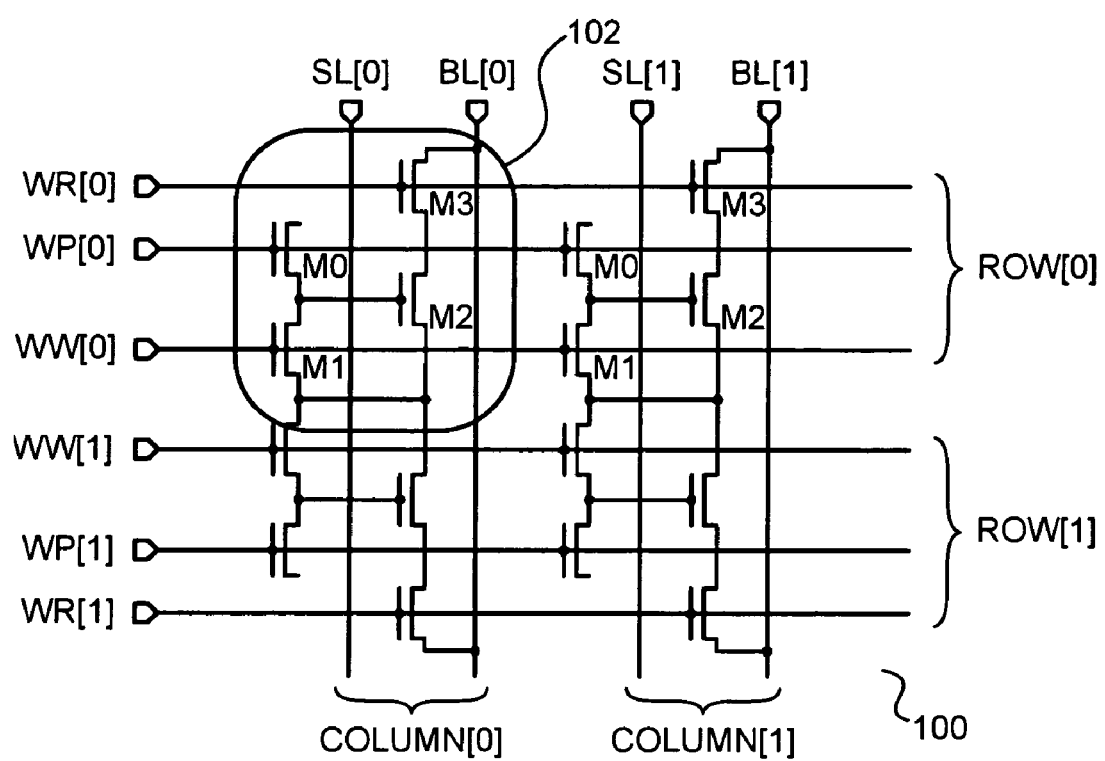
FIG. 1 is a schematic circuit diagram of a portion of a memory array in accordance with the present invention.

FIG. 1 shows an example of a memory array 100 formed in accordance of with the present invention. The memory array 100 is a two column by two row array, however, it can be appreciated that the array can be any arbitrary size. The memory array 100 includes four memory cells 102. Each row of memory cells has three connection lines: a read wordline WR, a program wordline WP, and a write wordline WW. Each column of memory cells has two connection lines: a column sourceline SL and a column bitline BL.

Figure 2:
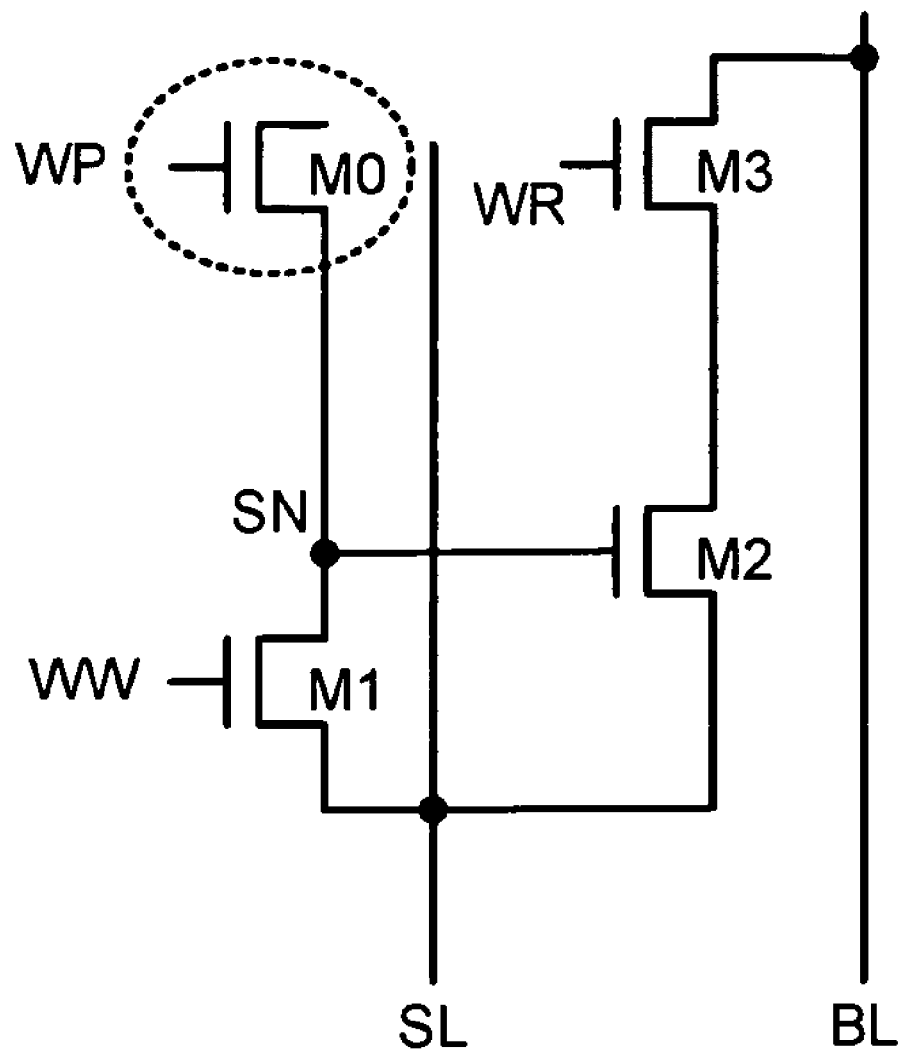
FIG. 2 is a partial layout diagram of a portion of the memory array represented by FIG. 1.

Each memory cell 102, referring to FIG. 2, includes a breakdown transistor M0, a write transistor M1, first sense transistor M2, and second sense M3. The breakdown transistor M0 is a "half" transistor that is the element that will be "programmed" by breakdown on the gate oxide. It can be appreciated that in alternative embodiments, the half transistor may be replaced with a MOS capacitor (or a polysilicon-oxide-semiconductor capacitor) or even a full transistor with a floating source. Thus, the term "breakdown transistor" as used herein and in the claims refers to a device that is programmed using breakdown of a gate oxide. The element to be programmed should be programmed using breakdown on the gate oxide.

The use of breakdown transistors M0 as data storage elements in the memory array 100 of FIG. 1 is advantageous because the transistors can be fabricated using many conventional CMOS processes using only a single polysilicon deposition step, without adding any mask steps to them. This is in contrast to "floating gate" type flash memory, which requires at least two polysilicon layers. Further, with modern technological advances, the size of a transistor can be made very small. For example, current 0.13 micron, 0.09 micron, and smaller line width processes would greatly increase density.

Although only a two by two memory array 100 is shown, in practice such memory arrays contain on the order of anywhere between 32 kilobits to about one gigabit or more of memory cells when fabricated using, for example, an advanced 0.09 μm CMOS logic process. Even larger memories will be realized as CMOS logic processes improve further. The memory array 100 in practice is organized into bytes and pages and redundant rows (not shown), which may be done in any desired manner. Many suitable memory organizations are well known in the art.

As seen in FIG. 2, the write transistor M1 is connected in series with the breakdown transistor M0. The breakdown transistor M0 has its gate connected to program wordline WP. The gate of the write transistor M1 is connected to write wordline WW. The drain of the write transistor M1 is connected to column sourceline SL.

A sense node SN between the breakdown transistor M0 and the write transistor M1 is connected to the gate of first sense transistor M2. The source of first sense transistor M2 is connected to the column sourceline SL and the drain of the first sense transistor M2 is connected to second sense transistor M3 such that M2 and M3 are in series. The gate of second sense transistor M3 is connected to read wordline WR and the drain of second sense transistor M3 is connected to column bitline BL.

To program the memory cell 102, the column signal line SL is set to low. A programming pulse (high voltage, VPP) is applied to the program wordline WP. Further, write transistor M1 is also turned on by biasing write wordline WW to, in one embodiment, about VPP/2. This results in breakdown of the gate oxide of the breakdown transistor M0, thus forming a conducting path. The programming may be controlled also by the amplitude and width of the VPP programming pulse. Further, the amount of programming current through the breakdown transistor M0 may be controlled by a current driver transistor (not shown) on the column signal line SL. Note that read wordline WR is at 0 volts during programming.

As can be seen in Table 1 below, the signal lines are biased in such a way that no transistor sees a voltage greater than VPP/2 between its terminals, except for the breakdown transistor being programmed.

Next, a read operation is described. Assume that the memory cell at coordinates (0, 0) in FIG. 1 is to be read. The column bitline BL is precharged to VDD. During the read operation, the write wordline WW of the memory cell to be read is held at 0 volts. The program wordline WP of the memory cell to be read is at VRD. During a read, the read wordline WR of the memory cell to be read is biased to VDD.

If the memory cell to be read at coordinates (0,0) is programmed, the storage node SN rises to a value high enough to turn on first sense transistor M2. In this case, the column bitline BL discharges through sense transistors M3 and M2. A sense amplifier (not shown) then signals when the voltage on the column bitline BL for the read memory cell falls below a predetermined reference voltage.

However, if the memory cell is unprogrammed, then node SN would remain close to 0 volts. Thus, even though second sense transistor M3 would be on, first sense transistor M2 would remain off and hence the charge on column bitline BL would be retained.

For cells that are not being read (unselected column and rows), the voltages are provided in Table 1 below.

TABLE 1

| ROW BIASING | | Selected Row (ROW[0]) | | Unselected Row (ROW[1]) | |
|---|---|---|---|---|---|
| Signal | Description | PGM M0 | READ M0 | PGM M0 | READ M0 |
| WP | PGM Wordline | VPP | VRD | VPP/2 | VRD |
| WW | Write Wordline | VPP/2 | 0 V | VPP/2 | 0 V |
| WR | Read Wordline | 0 V | VDD | VDD | 0 V |

| COLUMN BIASING | | Selected Column (COLUMN[0]) | | Unselected Column (COLUMN[1]) | |
|---|---|---|---|---|---|
| Signal | Description | PGM M0 | RD M0 | PGM M0 | RD M0 |
| SL | Source Line | 0 V | 0 V | VPP/2 | 0 V |
| BL | Bit Line | VDD | VDD (Pre-Q) | VDD | VDD |

In general, first sense transistor M2 is small such that the programmed resistance of the breakdown transistor M0 can drive the gate of the first sense transistor M2 quickly.

It can be appreciated that the precise magnitude of voltages applied is dependent upon the thickness of the gate oxide and other factors. Thus, for example, for a 0.09 micron CMOS process, the gate oxide is typically thinner, thereby requiring a lower programming voltage.

Moreover, the sizing of the transistors is may also be varied as various design considerations require. In one embodiment, in a 0.13 micron CMOS logic process, the transistors may have the following W/L ratios:

| Transistor | Width (microns) | Length (microns) |
|---|---|---|
| M0 | 0.32 | 0.24 |
| M1 | 0.32 | 0.18 |
| M2 | 0.3 | 0.13 |
| M3 | 0.3 | 0.13 |

Still, it can be appreciated that other sizes and ratios may be used and still stay within the spirit and scope of the present invention.

Figure 3:
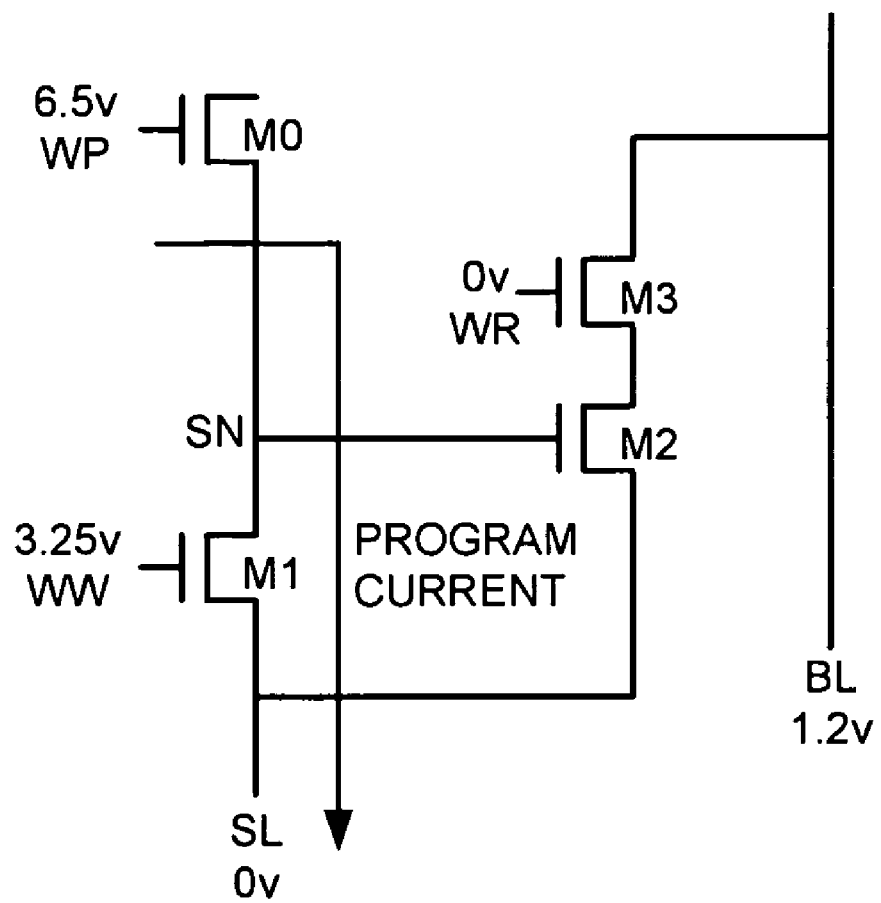
FIGS. 3–10 illustrate the programming and read voltages for selected and unselected cells.

In one embodiment, the various voltages can be seen in FIG. 3, which shows the programming of a memory cell. As seen, VPP in this embodiment is 6.5 volts and VDD is 1.2 volts. One consideration is that the resistance resultant from a programmed half transistor (M0) and the impedance from device B (M1) should result in a ratio such that the signal on node SN does not exceed VPP/2.

Figure 4:
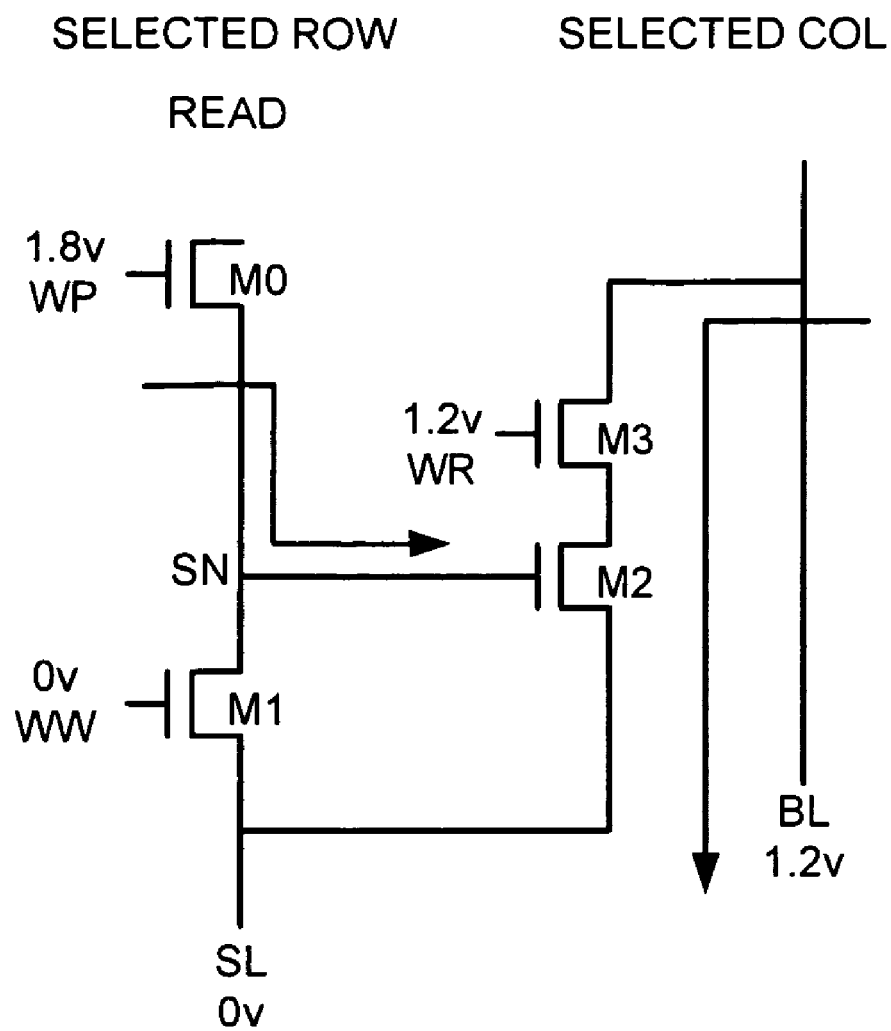

Turning to FIG. 4, the read voltages for a memory cell at a selected row and selected column is shown. Zero volts applied to the write wordline. A read voltage, VRD, of 1.8 volts is applied to the program wordline and 1.2 volts to the read wordline and the column bitline. The column sourceline is held at zero volts in this embodiment. Under these voltage biases, if the memory cell has been programmed, charge flows through the breakdown transistor M0 onto the sense node SN. This causes the charge on the column bitline to pass through the first sense transistor M2 and second sense transistor M3 onto the column sourceline. A sense amplifier on the column bitline will sense the drop in voltage which indicates a programmed cell. If the cell is unprogrammed, the breakdown transistor M0 will not place charge on the node SN and the column bitline will not drop in voltage.

Figure 5:
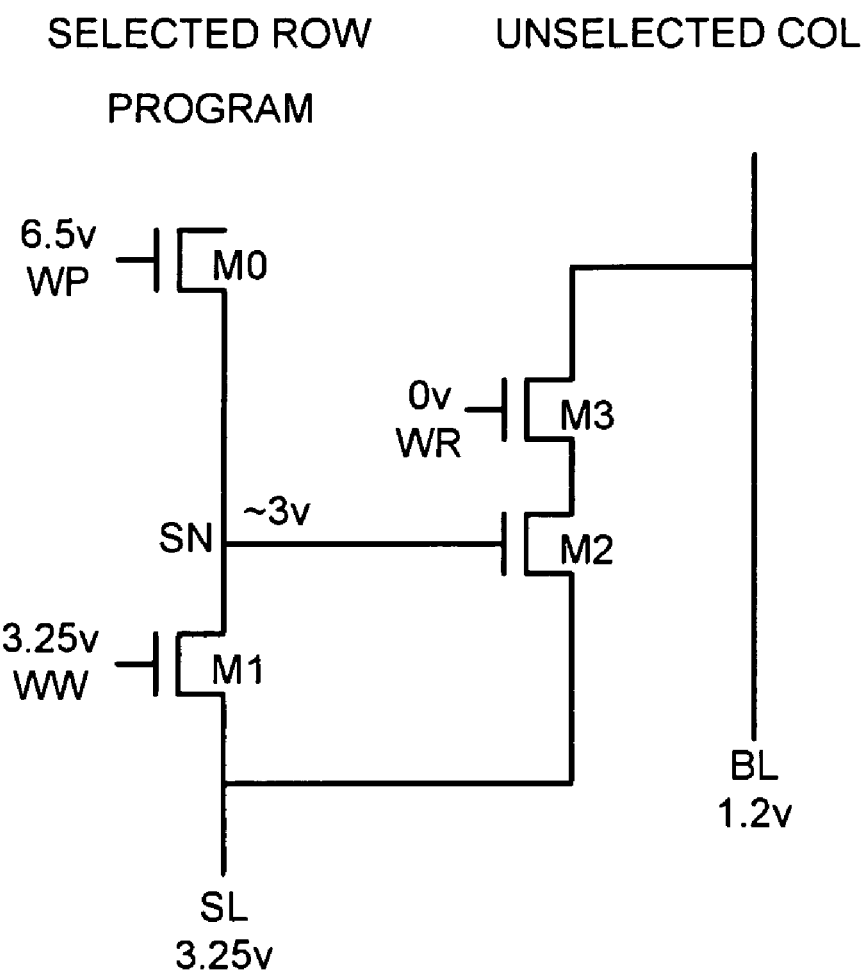

In the situation where the memory cell is in the selected row but unselected column, as shown in FIG. 5, during a programming process, the unselected column sourceline has a 3.25 volt supplied. This places an approximately 3 volt charge onto the source node SN and the result is that there is insufficient voltage across the breakdown transistor and the breakdown transistor M0 is not programmed.

Figure 6:
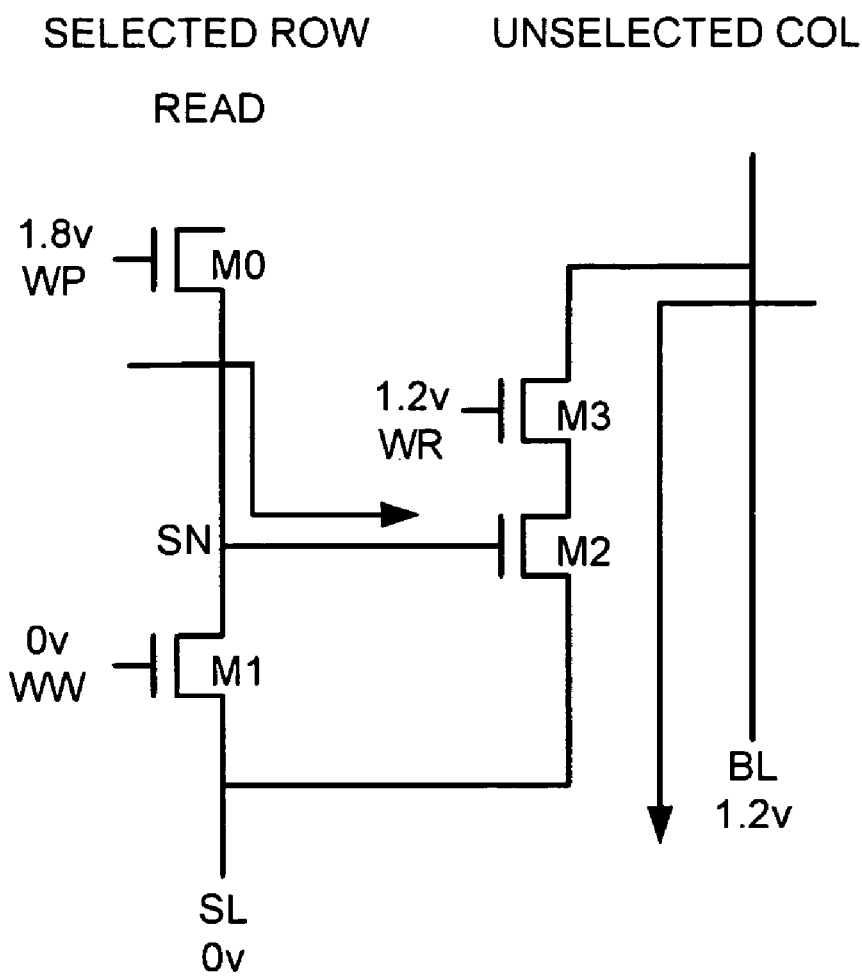

During the read operation of a selected row and unselected column, as shown in FIG. 6, the applied voltages and the effect is the same as if memory cell were being read in the selected row and selected column. However, because the sense amplifier is along the column bitline, and the column bitline is unselected, this is a "don't care" situation.

Figure 7:
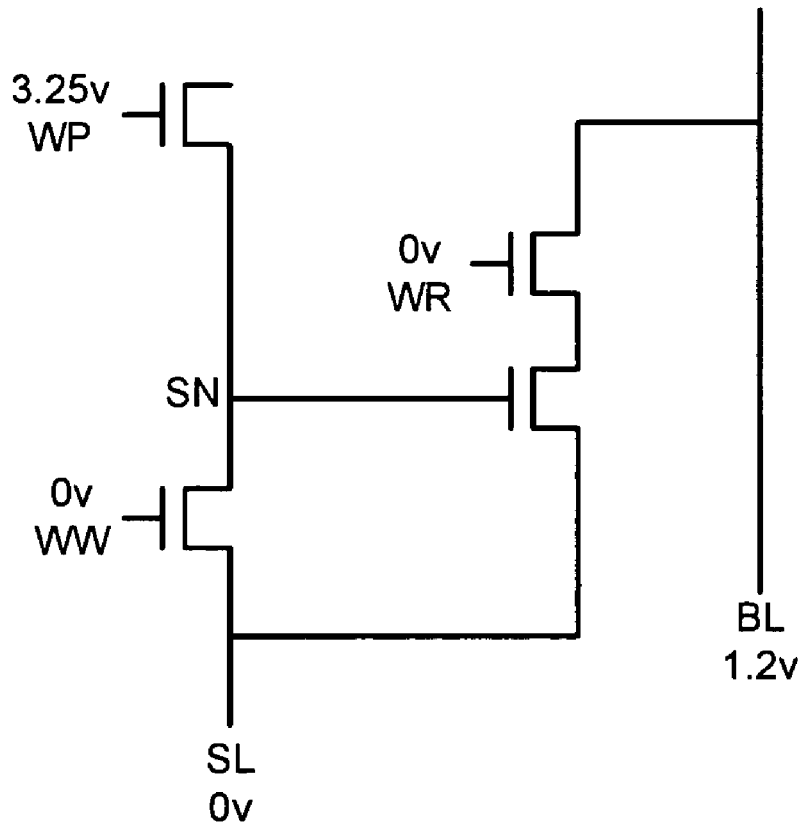

Next, turning to FIG. 7, the voltages applied for programming a memory cell in an unselected row and selected column are shown. In this situation, breakdown transistor M0 cannot program under these conditions.

Figure 8:
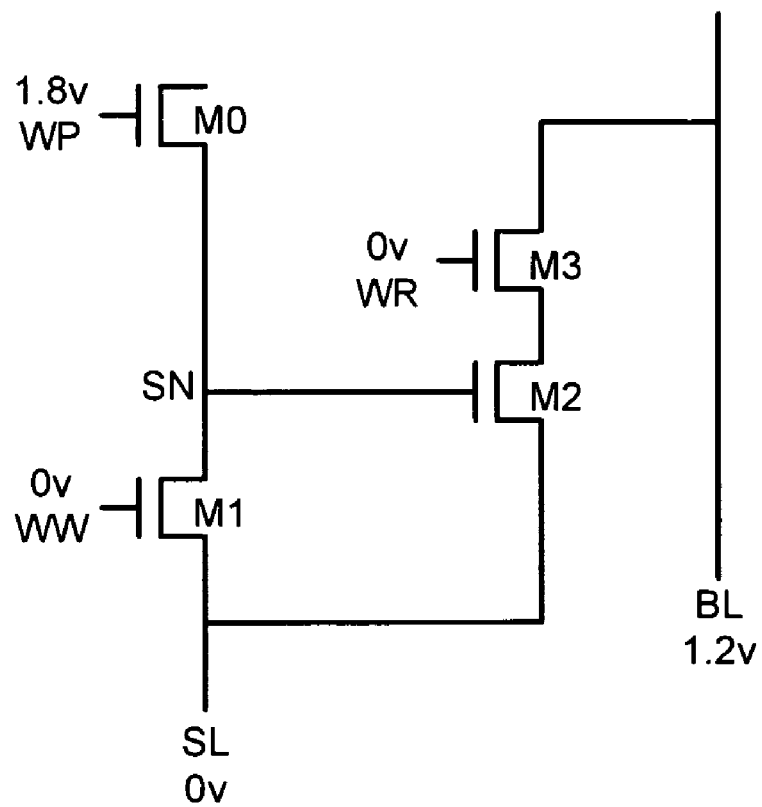

Next, turning to FIG. 8, the voltages applied during "read" of a memory cell in an unselected row and selected column is shown. In this situation, it doesn't matter if the breakdown transistor M0 is programmed or not. The voltage on node SN has no effect in this case because the read wordline is held at 0 volts.

Figure 9:
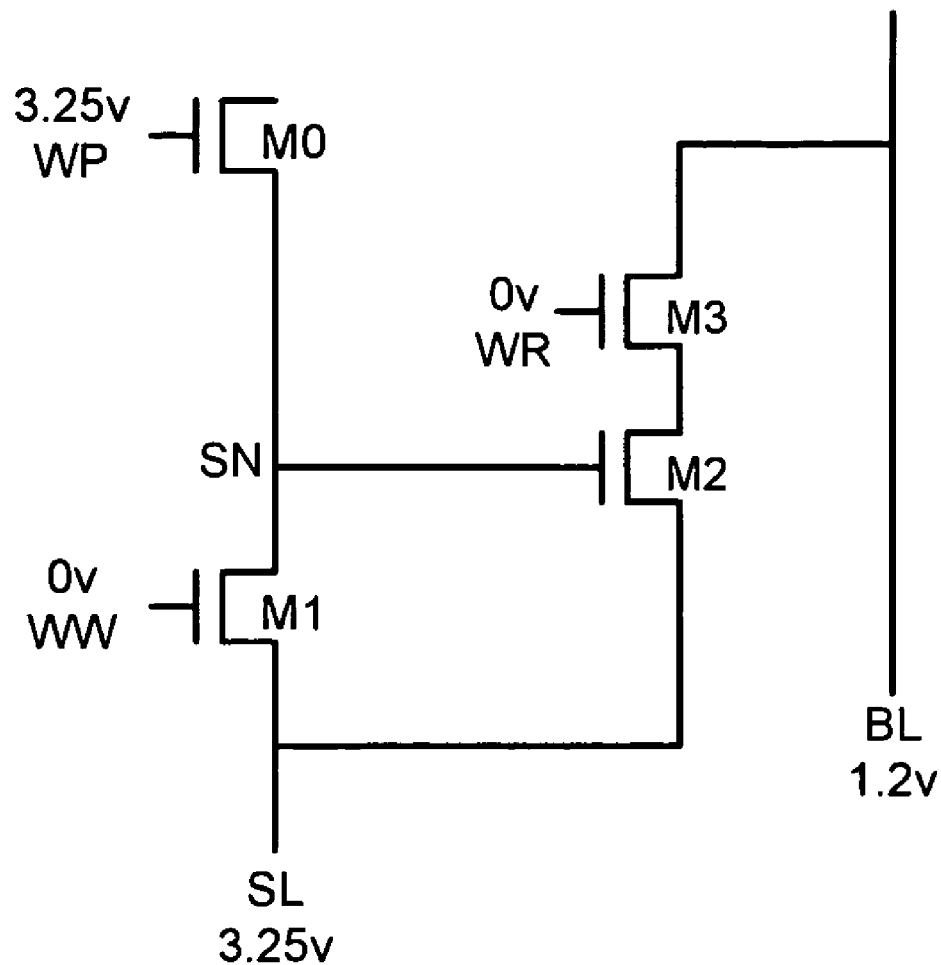

Turning to FIG. 9, during programming of a memory cell that is in an unselected row and unselected column, the program wordline is at 3.25 volts and the write wordline is at zero volts. Node SN will charge up if the breakdown transistor M0 had been previously programmed, but this has no effect. If the breakdown transistor M0 had not been programmed, sense node SN may collect charge through the M1 transistor and possibly through the breakdown transistor, but this will be handled during the read cycle.

Figure 10:
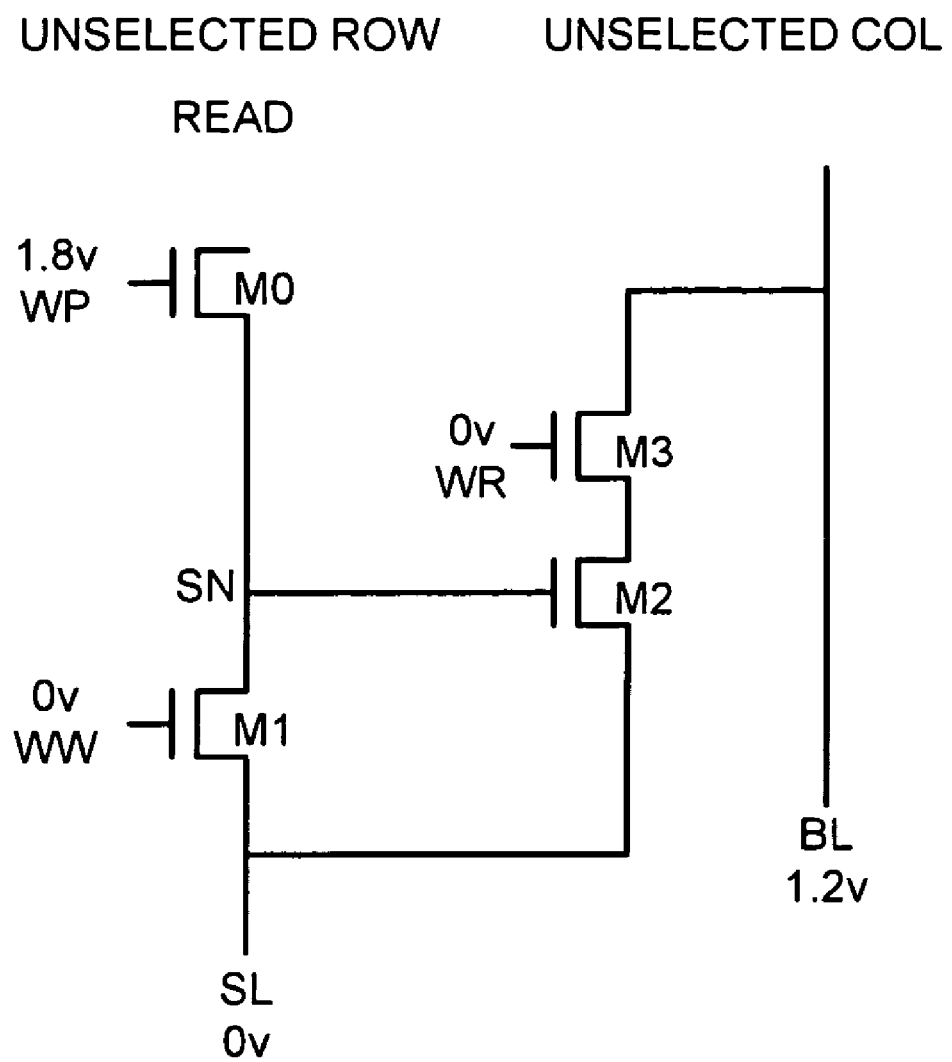

Specifically, turning to FIG. 10, during a read cycle of the unselected row and unselected memory cell, sense node SN will charge up if the breakdown transistor M0 is programmed. But this results in no effect in this case. If the breakdown transistor M0 is unprogrammed, the sense node SN could receive some charge possibly through the breakdown transistor M0, but this is handled in the selected row selected column read cycle.

Returning to FIG. 4, in the selected row selected column case, before the read wordline is asserted, the signal on the write wordline may have a short duration positive pulse designed to remove any leakage charge situated on the sense node SN. This will solve the problem of any stray charge on the sense node SN. If the breakdown transistor M0 is programmed, the sense node will be pulled down and then charged back up again through the programmed breakdown transistor M0. This is typically a very short time constant and thus the positive pulse on the write wordline can be made very short. After this is performed, the read wordline is asserted.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, the various voltages set forth in the various examples are only illustrative, since one has some discretion as to the precise voltage to select within a range of voltages, and the voltages are in any event dependent on the device characteristics. The terms row wordline and column bitline have been used to describe types of lines commonly used in memories, but some memories may have alternatives thereto. Further, the various doping types may be reversed, such that an n-channel transistor described above may be replaced with a p-channel transistor. These and other variations and modifications of the embodiments disclosed herein may be made without departing from the scope and spirit of the invention.

We claim:

1. A programmable memory cell formed useful in a memory array having column bitlines and row wordlines, the memory cell comprising:
   a breakdown transistor having its gate connected to a program wordline;
   a write transistor connected in series at a sense node to said breakdown transistor, said write transistor having its gate connected to a write wordline;
   a first sense transistor having its gate connected to said sense node; and
   a second sense transistor connected in series to said first sense transistor and having its gate connected to a read wordline, said second sense transistor having its source connected to a column bitline.

2. The memory cell of claim 1 wherein said write transistor has its source connected to a column sourceline.

3. The memory cell of claim 2 wherein said first sense transistor has its source connected to a column sourceline.

4. The memory cell of claim 1 wherein the drain of said first sense transistor is connected to the source of said second sense transistor.

5. The memory cell of claim 1 wherein said breakdown transistor is replaced with a MOS capacitor or polysilicon-oxide-semiconductor capacitor and said program wordline is connected to a polysilicon or metal layer of said capacitor.

6. The memory cell of claim 1 wherein said memory cell is programmed by applying a program voltage VPP to said program wordline and turning on said write transistor to allow programming current to flow through said breakdown transistor and onto a column sourceline.

7. The memory cell of claim 1 wherein said memory cell is read by turning off said write transistor, applying a read voltage VRD onto said program wordline and VDD to the gate of the second sense transistor, wherein said column bitline will have a decreasing voltage if said memory cell is programmed and a stable voltage if said memory cell is not programmed.

* * * * *